(12) United States Patent
van Kessel et al.

(10) Patent No.: US 8,834,963 B2
(45) Date of Patent: Sep. 16, 2014

(54) METHOD FOR APPLYING MATERIAL TO A SURFACE

(71) Applicant: International Business Machines Corporation, Armonk, NY (US)

(72) Inventors: Theodore G. van Kessel, Millbrook, NY (US); Brent A. Wacaser, Garrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/970,856

(22) Filed: Aug. 20, 2013

(65) Prior Publication Data

US 2014/0199499 A1 Jul. 17, 2014

Related U.S. Application Data

(63) Continuation of application No. 13/739,663, filed on Jan. 11, 2013.

(51) Int. Cl.
*C23C 16/455* (2006.01)
*B05D 1/00* (2006.01)

(52) U.S. Cl.
CPC ........................................ *B05D 1/00* (2013.01)
USPC .......................... 427/181; 427/248.1; 427/294

(58) Field of Classification Search
USPC ................................ 427/248.1, 180, 181, 294
See application file for complete search history.

(56) References Cited

U.S. PATENT DOCUMENTS

| | | | |
|---|---|---|---|
| 2,698,812 A | 1/1955 | Schladitz | |
| 3,775,156 A | 11/1973 | Singer | |
| 4,310,567 A | 1/1982 | Tabata et al. | |
| 4,511,600 A | 4/1985 | Leas | |
| 4,797,054 A * | 1/1989 | Arii | 414/217 |
| 6,148,764 A | 11/2000 | Cui et al. | |
| 6,165,554 A | 12/2000 | Halpern et al. | |
| 6,635,307 B2 | 10/2003 | Huang et al. | |
| 6,689,249 B2 * | 2/2004 | Ke et al. | 156/345.3 |
| 8,124,178 B2 | 2/2012 | Hass et al. | |
| 2001/0035129 A1 | 11/2001 | Chandra et al. | |

(Continued)

FOREIGN PATENT DOCUMENTS

| | | |
|---|---|---|
| CN | 102308174 | 1/2012 |
| CN | 102424958 | 4/2012 |
| WO | WO02087787 A1 | 11/2002 |
| WO | 2012091390 A2 | 7/2012 |

OTHER PUBLICATIONS

G. Riley, "Vapor Jet Deposition of Multi-Metal," Tutorial#62, Apr. 2006; pp. 1-4.

(Continued)

*Primary Examiner* — Bret Chen
(74) *Attorney, Agent, or Firm* — Cantor Colburn LLP; Vazken Alexanian

(57) ABSTRACT

A method for depositing a particle on a work piece is disclosed. The housing is coupled to the work piece to form a chamber and a separation distance between a surface of the work piece and a surface of the housing is controlled using a coupling device. A working gas having a particle entrained therein is directed within the chamber to deposit the particle at the work piece. The coupling between the housing and the work piece may be a slidable coupling. The coupling device may include an air-bearing surface or a gasketed coupling.

15 Claims, 4 Drawing Sheets

(56) References Cited

U.S. PATENT DOCUMENTS

| | | | |
|---|---|---|---|
| 2003/0205251 A1* | 11/2003 | Raaijmakers et al. | 134/57 R |
| 2004/0077105 A1* | 4/2004 | Wu et al. | 436/524 |
| 2004/0134430 A1 | 7/2004 | Hass et al. | |
| 2005/0000251 A1* | 1/2005 | Dabby et al. | 65/414 |
| 2005/0145171 A1 | 7/2005 | Noji et al. | |
| 2005/0221018 A1* | 10/2005 | Mehta et al. | 427/458 |
| 2007/0199510 A1 | 8/2007 | Weiner et al. | |
| 2009/0104377 A1 | 4/2009 | Yoshida et al. | |
| 2009/0176016 A1 | 7/2009 | Long et al. | |
| 2010/0006033 A1 | 1/2010 | Tanaka | |
| 2010/0132614 A1* | 6/2010 | Kato et al. | 118/723 R |
| 2012/0091095 A1* | 4/2012 | Wang et al. | 216/37 |
| 2012/0137974 A1 | 6/2012 | Hass et al. | |

OTHER PUBLICATIONS

S. Forrest, "Direct Printing of Organic Electronics at the Nanometer Scale" Final Report—Princeton University, Princeton, NJ; Feb. 28, 2006, pp. 1-24.

J. Groves, "Directed Vapor Deposition," A Dissertation Presented to the Faculty of the School of Engineering and Applied Science University of Virgiinia; May 1998; pp. 1-370.

* cited by examiner

METHOD FOR APPLYING MATERIAL TO A SURFACE

CROSS REFERENCE TO RELATED APPLICATIONS

The present application is a continuation of U.S. patent application Ser. No. 13/739,663, entitled "METHOD AND APPARATUS TO APPLY MATERIAL TO A SURFACE", filed on Jan. 11, 2013, which is incorporated herein by reference in its entirety.

BACKGROUND

The present invention relates to methods of chemical deposition, and more specifically, to depositing chemicals to large and irregular workpieces.

Plating and vacuum deposition methods as well as other particle deposition methods are routinely used to apply semiconductor and metal films to surfaces. These deposition methods include, but are not limited to, evaporation, sputtering, chemical deposition and plasma deposition. To perform particle deposition, a workpiece is placed in a chamber, the chamber is evacuated, and the particles are deposited on the workpiece in the evacuated chamber. For large or irregularly shaped work pieces, large chamber sizes are required, which comes with increased cost. In addition, some of these particle deposition methods are inefficient with respect to material when used on large or irregularly shaped workpieces, in that a small fraction of the evaporated material successfully locates on the work piece.

SUMMARY

According to one embodiment of the present disclosure, an apparatus is disclosed that includes: a housing configured to couple to a work piece to form a chamber; and a nozzle configured to direct a working gas within the chamber to deposit a particle entrained in the working gas at the work piece.

According to another embodiment of the present disclosure, a particle deposition device is disclosed that includes: a work piece; a housing configured to couple to the work piece to form a chamber; and a flow channel within the chamber configured to direct a working gas including a particle at the work piece to deposit the particle onto the work piece.

According to another embodiment of the present disclosure, a particle deposition device is disclosed that includes: a housing configured to couple to a work piece to form a chamber; a coupling device on the housing configured to maintain a slidable coupling between the housing and the work piece; and a directed working gas for depositing a particle on a surface of the work piece that forms the chamber.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
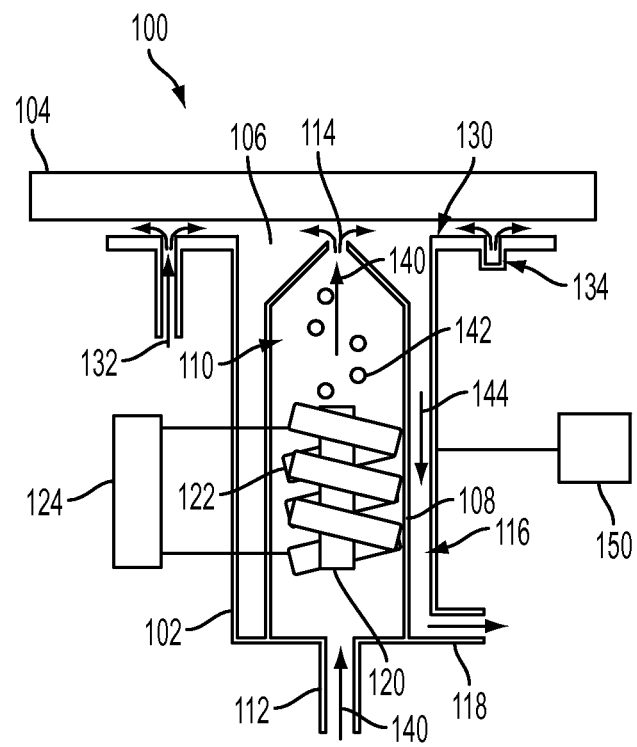
FIG. 1 shows an exemplary particle deposition apparatus in one embodiment of the present disclosure.

FIG. 1 shows an exemplary particle deposition apparatus 100 in one embodiment of the present disclosure. The exemplary deposition apparatus 100 includes a housing 102 configured to couple to a workpiece 104 to form a gas containment chamber 106 therein. Thus, the work piece 104 forms a wall of the formed chamber 106, rather than being a component that is placed inside the chamber 106. The housing 102 and its various components may be made of various materials including but is not limited to glass, quartz, alumina, zirconia, stainless steel, brass, copper, aluminum, nickel, chrome, iron, magnesium, gold, silver, and tin. In one embodiment, the housing 102 includes a coupling device that couples the housing 102 to the work piece 104. The exemplary coupling device maintains a separation distance between a surface of the housing 102 and a surface of the work piece 104. The coupling device may also create a seal between the housing 102 and the work piece 104 that isolates the chamber 106 from an outside environment. The coupling device may also provide a slidable coupling between the housing 102 and the work piece 104. An exemplary separable coupling may include an air bearing device, a gasket or other coupling device that isolates the chamber from an outside environment at an interface of the housing 102 and the work piece 104. A pressure within the chamber 106 may be reduced by flow of a working gas within the chamber. Alternatively, a pump 150 may be coupled to the housing 102 to evacuate the chamber 106 to produce a partial vacuum therein.

The chamber 106 may include one or more passages for directing a flow of gas throughout the chamber 106. In an exemplary embodiment, housing 102 includes a manifold 108 that creates a working gas channel 110 within the chamber 106. The manifold 108 includes an inlet 112 and a nozzle 114. A working gas flows into the manifold 108 at the inlet 112 and flows out of the manifold 108 at the nozzle 114. The nozzle 114 may be placed proximate the work piece 104 such that working gas flowing out of the nozzle 114 is directed at the work piece 104. In various embodiments, the working gas exits nozzle 114 at high velocities, such as a velocity substantially at a speed of sound in the working gas, i.e., Mach 1. This condition is achieved by maintaining a pressure in the manifold 108 that is higher than the pressure in the chamber 106 such that the gas flows from the manifold 108 through the nozzle 114 and into the chamber 106 and impinges on the work piece 104.

In an exemplary embodiment, the working gas channel 110 includes a source 120 of particles 142 to be deposited at the work piece 104. A heating element 122 such as a heater coil may be proximate the source 102. The heating element 122 may be coupled to a power supply 124 that may be adjusted to raise and/or lower a temperature at the heating element 122. The heating element 122 may thus impart heat to the source 120. When heated above a selected temperature, the source 120 emits atomized or evaporated particles 142 into the working gas 140. The evaporated particle may include atoms, atomic cluster, molecules, etc. The working gas 140 thereby entrains the evaporated particles 142 and conveys them through the nozzle 114 to impinge on the work piece 104. In general, the entrained evaporated particles 142 impinging on the work piece 104 adhere to a surface of the work piece 104. The working gas thus deposits particles entrained therein onto a surface of the work piece 104 that forms an inner wall of the chamber 106. In one embodiment, a charge may be applied to the evaporated particles 142 relative to the work piece 104 to enhance an attraction or adhesion between the evaporated particles 142 and the work piece 104. Applying a charge on the evaporated particles 142 may also be used to modify a distribution of the evaporated particles 142 at the surface of the work piece 104.

The source of particles may comprise an evaporated source as described above where a material is heated and thereby caused to evaporate particles into the working gas stream. In an alternate embodiment, the particle source may be a gas containing particles or particle precursors introduced into the manifold with a separate pipe. In another alternate embodiment, the particle source may comprise a material in the presence of a plasma that causes the material to sputter into the working gas stream. In one embodiment, the sputtered material comprises a material that includes but is not limited to at least one of a semiconductor, a metal, an insulator, silicon, germanium, aluminum, gold, silver, palladium, and platinum. Alternately, the particle source may a chemical source that emits chemical particles upon a chemical reaction. Two or more reactive chemicals may be provided that form a particle that is delivered into the working gas stream. The particle source may further include a reactive working gas that interacts chemically with the work piece 104 to facilitate particle deposition.

While the evaporated particles 142 adhere to the surface of the work piece 104, the working gas 140, which is generally lighter and less dense than the evaporated particles 142, flows along the surface of the work piece 104. Once the working gas 140 has deposited its entrained evaporated particles at the workpiece 104, it may continue through the chamber 106 as an exhaust gas 144. The exhaust gas 144 is channeled via the exhaust channel 116 to an exhaust gas outlet 118, whereupon the exhaust gas 144 exits the housing 102. In an exemplary embodiment, the exhaust channel 116 is a region exterior to the flow cavity manifold 108 and interior to the housing 102.

In an exemplary embodiment, the working gas 140 includes a non-reactive gas and therefore does not interact chemically with either the evaporated particles 142 or the work piece 104. In alternative embodiments, the working gas 140 includes a gas that reacts with either the work piece 104 or the evaporated particles. Such a gas may be used, for example, to prevent oxidation of a metallic work piece 104 during deposition.

In one embodiment, the working gas channel 110 is configured to eliminate a direct line of sight between the heating element 122 and/or source 120 and the work piece 104. This channel configuration therefore prevents significant amounts of radiant heat from the heating element 122 and/or source 120 from being transferred to the work piece 104. In one embodiment, baffles may be placed in the working gas channel 110 to block conduction of radiant heat to the work piece 104.

The exemplary housing 102 may include an air-bearing surface 130 that may be placed proximate a surface of the workpiece 104. Exemplary air-bearing surface 130 includes a pressurizing gas inlet 132 that supplies a gas referred to herein as a pressurizing gas to a surface of the work piece 104. A pressuring gas cavity 134 spreads the pressuring gas circumferentially along the air-bearing surface 130. The pressuring gas then flows between the work piece 104 and the air bearing surface 130 of the housing 102 to maintain a cushion of air or gas that provides a separation gap. Exemplary gases that may be used to maintain the cushion at the air bearing surface 130 may include air, argon, helium, oxygen, nitrogen or any mixture of these gases. Additionally, the pressurizing gas provides a seal between the housing 102 and the work piece 104 that prevents gases from escaping the chamber 106 via the separation gap between the housing 102 and the work piece 104. Differential pressures are maintained between the pressurizing gas, the chamber 106 and the manifold 108 such that the work piece 104 is maintained at a given distance from the housing 102 and the working gas flow from the manifold 108 into the chamber 106 is maintained at the desired rate. This may be achieved by gas regulation and pumping methods.

Figure 2:
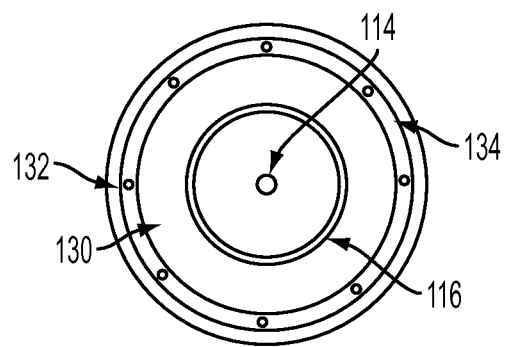
FIG. 2 shows a top view of the exemplary deposition apparatus of FIG. 1.

FIG. 2 shows a top view of the exemplary deposition apparatus 100 of FIG. 1. The air-bearing surface 130 includes the pressurizing gas cavity 134 that includes pressurizing gas inlets 132. In various embodiments, the pressurizing gas cavity 134 forms a cavity, groove or slot within air-bearing surface 130. In various embodiments, the cavity 134 extends circumferentially. Pressurizing gas is introduced into the pressurizing gas inlets 132 and is distributed circumferentially around the housing via the pressurizing cavity 134. The pressurizing gas then spills out of the pressurizing cavity 134 to flow along the air-bearing surface 130. At the air-bearing surface 103, the pressurizing gas may either flow away from the air-bearing cavity 134 to escape to the surrounding environment or towards the chamber 106 (FIG. 1). Pressurized gas that flows into the chamber 106 may be taken up into the exhaust cavity 116 where it exits the chamber 106 via the exhaust gas outlet (see 118, FIG. 1). The pressurized gas flowing along the air-bearing surface 130 provides a cushion of pressurizing gas between the housing 102 and the 104. The pressurized gas cushion also isolates working gases within the chamber 106 from escaping to the surrounding environment via the separation gap between housing 102 and work piece 104. The seal provided by the pressurized gas cushion therefore enables creation of a partial vacuum in the chamber 106. Thus, the pressurizing gas may perform at least one of: controlling a spacing of the nozzle and/or the air-bearing surface 130 relative to the work piece 104, regulating a gas pressure within the housing 102, isolating the working gas from the immediate environment, and allowing the housing 102 to be translated relative to the work piece 104 during the particle deposition process, i.e., by sliding along a surface of the workpiece 104.

In an exemplary embodiment, the pressurizing gas introduced via the pressurizing gas inlets 132 creates a positive pressure zone in a region proximate the pressurized gas cavity 134. Meanwhile, the nozzle 114 and exhaust channel 116 create a negative pressure zone. The separation distance between the air-bearing surface 130 and the work piece is a function of the pressures in the positive pressure zone and the negative pressure zone. The pressures of the positive pressure zone and the negative pressure zone may therefore be adjusted to control the separation distance. In an exemplary embodiment, the negative pressure of the exhaust channel 116 is selected to be less than a gas pressure inside of the working gas channel 110 so that working gas may stream through nozzle 114 at a selected velocity. Gas pressure may be controlled in the apparatus 100 such that working gas 140 may be run at low pressure but have a high speed through the nozzle 114. In one embodiment, a gas pressure in the working gas channel 110 is about 1 torr and a gas pressure in the exhaust channel 116 is less than 1 torr.

The pressurizing gas may include one of a reactive gas and a non-reactive gas. Because some gas escapes the sides of the air-bearing surface to the environment, a pressurizing gas may be selected that is considered safe with respect to humans. An exemplary non-reactive gas that may be used as the pressurizing gas may include helium, argon, and nitrogen, among others. Alternatively, when the working gas is a reactive gas, the pressurizing gas may be selected to dilute and neutralize a reactive working gas and thereby prevent otherwise toxic or dangerous gases from exiting the housing 102 via the exhaust 118.

Figure 3:
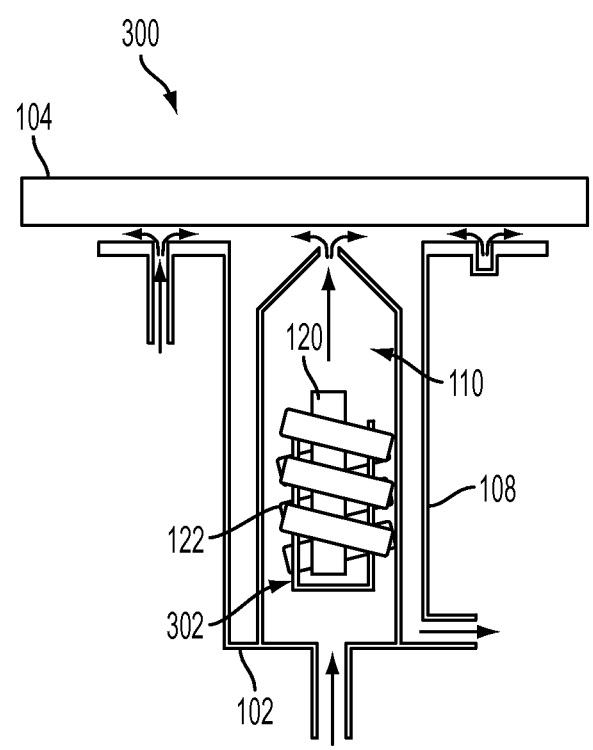
FIG. 3 shows an alternative embodiment of the particle deposition apparatus of the present disclosure.

FIG. 3 shows an alternative embodiment of the particle deposition apparatus of the present disclosure. In the alternative embodiment, the source 120 may be housed in a crucible 302. The crucible 302 may be made of a material that may be raised to a high temperature, i.e., an evaporation temperature of the source 120, without reacting with the evaporated particles 142 from the source 120. Exemplary materials for forming the crucible 302 include, but are not limited to, alumina, zirconia, tungsten, nickel-chromium alloy (Nichrome) and tantalum. Electrical connections to the heating element 124 and various support structures for the heating element 124 may be made of material that may include but is not limited to boron nitride, quartz, aluminum nitride, mica and aluminum oxide. The crucible 302 may include a Knudson cell in various embodiments.

Figure 4:
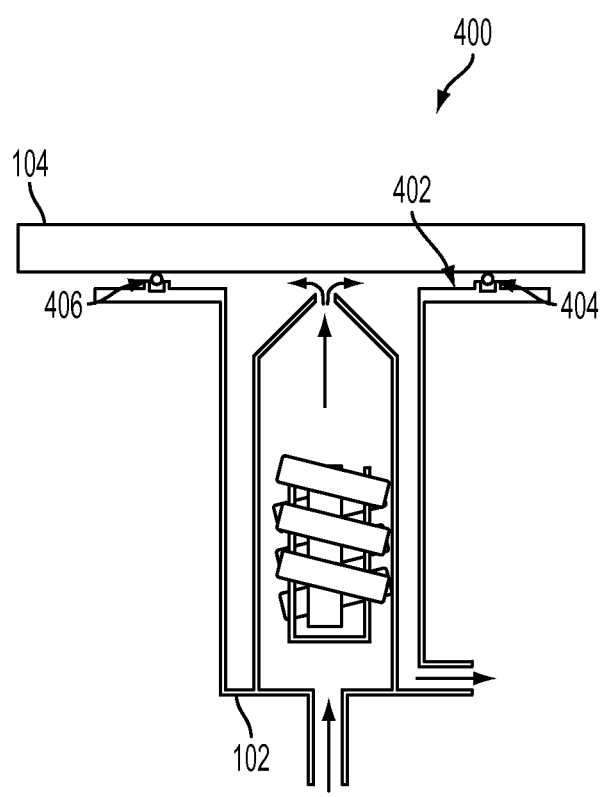
FIG. 4 illustrates an alternative embodiment of the present disclosure that includes an alternative coupling device.

FIG. 4 illustrates an alternative embodiment of the present disclosure that includes an alternative coupling device. In one embodiment, the housing 102 includes a flanged surface 402. The exemplary flanged surface 402 includes a recess cavity 404 configured to constrain a gasket 406 therein. Flanged surface 402 may be pressed against the work piece 104 such that gasket 406 forms a seal between the work piece 104 and the flanged surface 402, wherein the surfaces of the work piece 104 and the flanged surface 402 are separated by a separation gap. The housing 102 may therefore slide along a surface of the work piece 104 while maintaining the seal. In various embodiments, gasket 406 may be made of at least one of rubber, buna rubber, Viton, nylon, silicone, metal, cork, felt, neoprene, nitrile rubber, Teflon, and polytetrafluoroethylene (PTFE), etc. This list of gasket materials is not inclusive and other gaskets usable at the flanged surface 402 may be made of materials not specifically disclosed herein. The gasket 406 may also be lubricated using, for example, Kyrtox, petroleum base oil, silicon and Apiezon grease. This list of lubricants is not inclusive and other lubricants may be used that are made of ingredients not specifically disclosed herein.

Figure 5:
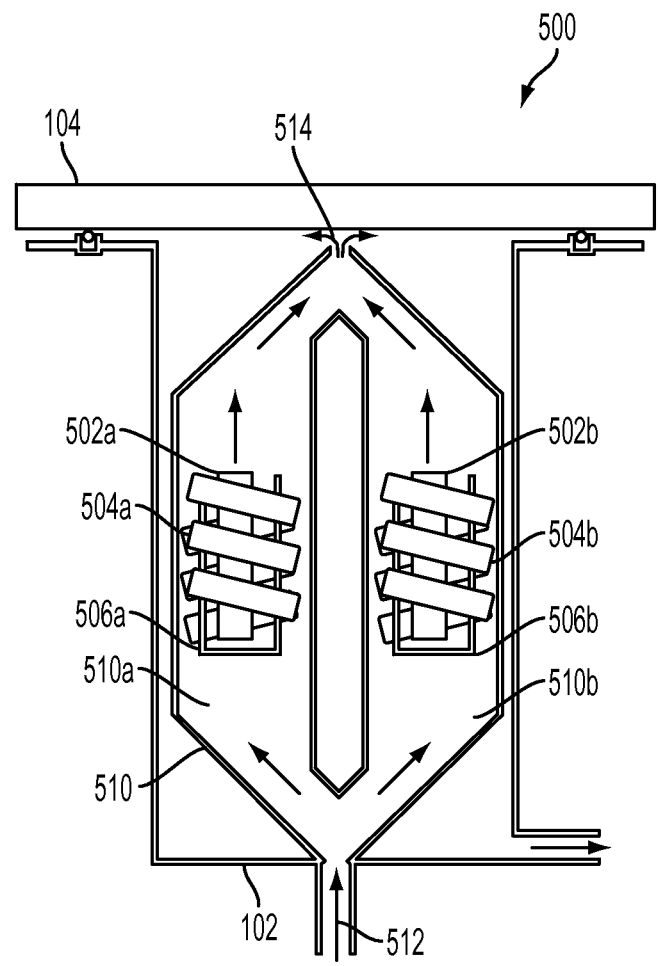
FIG. 5 shows an alternative embodiment of the deposition apparatus for depositing a plurality of particles on a work piece.

FIG. 5 shows an alternative embodiment of the deposition apparatus 500 for depositing a plurality of particles on a work piece 104. The alternate deposition apparatus 500 includes a plurality of sources, such as exemplary sources 502a and 502b. The plurality of sources 502a and 504b may be used to create a gas mixture at nozzle 514 having a selected chemical composition. In the illustrative example shown in FIG. 5, the working gas channel 510 is split into two channels 510a and 510b. Source 502a is located in channel 510a and source 502b is located in channel 510b. The working gas 512 flows into the working gas channels 510a and 510b to entrain particles evaporated from each of the sources 502a and 502b. The channels 510a and 510b recombine at nozzle 514 to create a working gas having a selected chemical composition. The rate at which particles are introduced from sources 502a and 502b into their respective flow channels 510a and 510b can be independently controlled, generally by controlling a temperature of their respective heating elements. Furthermore, flow rates in each of the flow channels 510a and 510b may be independently controlled. Therefore, in the various embodiments, the chemical composition of the gas mixture may be controlled by altering at least one of a temperature of one or more of the sources and a gas flow at one or more of the channels.

In alternate embodiments, the working gas channel 510 may include more than one nozzle, whereas each nozzle corresponds to a channel (i.e., channels 510a and 510b). In yet another embodiment, each of channels 510a and 510b may include its own gas inlets; therefore gas flow into each channel 510a and 510b may be independently controlled.

By controlling the various operation parameters of the exemplary particle deposition apparatus 500, the composition and/or profile of a layer formed at the work piece 104 may be controlled. Therefore multilayer films and/or complex layers may be formed on a deposition surface of the work piece 104. For example, particles from two or more sources may be deposited simultaneously to form a film on the work piece that is a mixture of the particles from the two or more sources. Additionally, a selected area of the work piece 104 may be scanned multiple times by the deposition apparatus 102 to provide multiple layers. In one aspect, the composition of one layer may be selected to be different than a composition of another layer by changing chemical composition parameters (i.e., temperatures, gas velocities, etc.) in between scans. Additionally, chemical compositions of the deposited layer may be made to have vertical gradations (gradations into the surface) or horizontal gradations (gradations moving along the surface).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of depositing a particle on a work piece, comprising:
    coupling a housing to the work piece to form a chamber;
    controlling a separation distance between a surface of the work piece and a surface and a surface of the housing a coupling device that is at least one of an air-bearing surface and a gasketed coupling; and
    directing a working gas having the particle entrained therein within the chamber to deposit the particle at the work piece.

2. The method of claim 1, further comprising coupling the housing to the work piece to provide a vacuum in the chamber.

3. The method of claim 1, further comprising slidably coupling the housing to the work piece to form the chamber.

4. The method of claim 1, further comprising introducing the particle into the working gas from a source disposed in the working gas.

5. The method of claim 4, further comprising controlling a rate of introducing the particle into the working gas.

6. The method of claim 5, wherein the source includes at least one of a heating element; a crucible; an evaporant material; a Knudson cell; a gas containing the particle, a material in the presence of a plasma that emits the particle in the presence of the plasma; a reactive working gas that interacts chemically with the workpiece to facilitate particle deposition; and a chemical source undergoing a chemical reaction to emit the particle.

7. The method of claim 4, wherein the source further comprises a first source and a second source, wherein a particle introduction rate of the first source is independent of the particle introduction rate of the second source.

8. A method of depositing a particle on a surface, comprising:
    slidably coupling a housing to a work piece via at least one of an air bearing surface and a gasketed surface to form a chamber, wherein the work piece forms an inner wall of the chamber;
    directing a working gas including a particle at the surface to deposit the particle onto the surface.

9. The method of claim 8, further comprising introducing the particle into the directed working gas from a source disposed in the working gas.

10. The method of claim 9, wherein the source further comprises at least two sources and a rate of particle introduction into the flow of the at least two sources is independently controllable.

11. A method of particle deposition, comprising:
    coupling a housing to a work piece to form a chamber;
    using a coupling device on the housing to maintain a slidable coupling between the housing and the work piece, wherein the coupling device is at least one of an air-bearing device and a gasketed device; and
    directing a working gas onto a surface of the work piece that forms the chamber, the working gas including a particle for particle deposition at the surface.

12. The method of claim 11, further comprising maintaining a vacuum in the chamber using the slidable coupling between the housing and the work piece.

13. The method of claim 11, further comprising using the coupling device to maintain a selected separation distance between the housing and the work piece.

14. The method of claim 11, further comprising introducing the particle into the working gas from at least one of two particle sources disposed in the working gas.

15. The method of claim 11, wherein the working gas is directed through a flow channel that separates into at least two flow channels.

* * * * *